United States Patent
Park et al.

(10) Patent No.: US 10,256,839 B2
(45) Date of Patent: *Apr. 9, 2019

(54) LOW DENSITY PARITY CHECK ENCODER HAVING LENGTH OF 16200 AND CODE RATE OF 5/15, AND LOW DENSITY PARITY CHECK ENCODING METHOD USING THE SAME

(71) Applicant: ELECTRONICS AND TELECOMMUNICATIONS RESEARCH INSTITUTE, Daejeon (KR)

(72) Inventors: Sung-Ik Park, Daejeon (KR); Heung-Mook Kim, Daejeon (KR); Sun-Hyoung Kwon, Daejeon (KR); Nam-Ho Hur, Sejong (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/641,084

(22) Filed: Jul. 3, 2017

(65) Prior Publication Data
US 2017/0302298 A1    Oct. 19, 2017

Related U.S. Application Data

(63) Continuation of application No. 15/272,163, filed on Sep. 21, 2016, now Pat. No. 9,729,173, which is a
(Continued)

(30) Foreign Application Priority Data

Aug. 14, 2014 (KR) .................. 10-2014-0106176
Sep. 11, 2014 (KR) .................. 10-2014-0120011

(51) Int. Cl.
*H03M 13/25* (2006.01)
*H04L 1/00* (2006.01)
(Continued)

(52) U.S. Cl.
CPC ....... *H03M 13/255* (2013.01); *H03M 13/036* (2013.01); *H03M 13/1102* (2013.01);
(Continued)

(58) Field of Classification Search
CPC .......... H03M 13/116; H03M 13/1165; H03M 13/255; H03M 13/1185; H03M 13/1102;
(Continued)

(56) References Cited

U.S. PATENT DOCUMENTS 9,225,358 B2 * 12/2015 Park ..................... H03M 13/116
2008/0178065 A1    7/2008 Khandekar et al.
(Continued)

FOREIGN PATENT DOCUMENTS

| KR | 10-2007-0058438 A | 6/2007 |
| KR | 10-2013-0135746 A | 12/2013 |
| WO | WO 2006/001666 A2 | 1/2006 |

OTHER PUBLICATIONS

"Digital Video Broadcasting (DVB); Frame structure channel coding and modulation for a second generation digital terrestrial television broadcasting system (DVB-T2)", Final draft ETSI EN 302 755, Oct. 2010, p. 1 -177, VI .2.1., European Standard (Telecommunications Series).*
(Continued)

*Primary Examiner* — John J Tabone, Jr.

(57) ABSTRACT

A low density parity check (LDPC) encoder, an LDPC decoder, and an LDPC encoding method are disclosed. The LDPC encoder includes first memory, second memory, and a processor. The first memory stores an LDPC codeword having a length of 16200 and a code rate of 5/15. The second
(Continued)

memory is initialized to 0. The processor generates the LDPC codeword corresponding to information bits by performing accumulation with respect to the second memory using a sequence corresponding to a parity check matrix (PCM).

5 Claims, 5 Drawing Sheets

Related U.S. Application Data continuation of application No. 14/496,432, filed on Sep. 25, 2014, now Pat. No. 9,479,289.

(51) Int. Cl.
*H03M 13/11* (2006.01)
*H03M 13/00* (2006.01)
*H03M 13/03* (2006.01)

(52) U.S. Cl.
CPC ...... *H03M 13/1105* (2013.01); *H03M 13/116* (2013.01); *H03M 13/1165* (2013.01); *H03M 13/1185* (2013.01); *H03M 13/616* (2013.01); *H04L 1/0043* (2013.01); *H04L 1/0057* (2013.01)

(58) Field of Classification Search
CPC .......... H03M 13/1105; H03M 13/616; H03M 13/036; H04L 1/0057; H04L 1/0043
USPC ................... 714/758, 776, 800, 80
See application file for complete search history.

(56) References Cited

U.S. PATENT DOCUMENTS

| | | | | |
|---|---|---|---|---|
| 2010/0146371 | A1* | 6/2010 | Efimov | H03M 13/1111 714/780 |
| 2014/0157079 | A1* | 6/2014 | Park | H03M 13/116 714/758 |
| 2015/0039973 | A1* | 2/2015 | Jeong | H03M 13/11 714/776 |
| 2015/0082118 | A1* | 3/2015 | Jeong | H03M 13/1165 714/758 |
| 2015/0082131 | A1* | 3/2015 | Jeong | H04L 1/0071 714/776 |
| 2015/0089320 | A1* | 3/2015 | Jeong | H03M 13/255 714/758 |
| 2015/0089321 | A1* | 3/2015 | Myung | H03M 13/036 714/758 |
| 2015/0095744 | A1* | 4/2015 | Jeong | H03M 13/2792 714/776 |
| 2015/0100844 | A1* | 4/2015 | Park | H03M 13/1177 714/752 |
| 2015/0100845 | A1* | 4/2015 | Myung | H03M 13/2778 714/752 |
| 2015/0121176 | A1* | 4/2015 | Myung | H04L 1/0041 714/776 |
| 2015/0128005 | A1* | 5/2015 | Jeong | H03M 13/036 714/752 |
| 2015/0214982 | A1* | 7/2015 | Park | H04L 27/20 714/752 |
| 2015/0229328 | A1* | 8/2015 | Park | H03M 13/6552 714/776 |
| 2015/0229334 | A1* | 8/2015 | Park | H03M 13/2792 714/776 |
| 2015/0229335 | A1* | 8/2015 | Park | H03M 13/2792 714/776 |
| 2015/0229336 | A1* | 8/2015 | Park | H03M 13/2792 714/776 |
| 2015/0236720 | A1* | 8/2015 | Park | H03M 13/116 714/752 |
| 2015/0236721 | A1* | 8/2015 | Kim | H04L 1/0041 714/776 |
| 2015/0236722 | A1* | 8/2015 | Park | H03M 13/036 714/776 |
| 2015/0236816 | A1* | 8/2015 | Myung | H04L 1/0041 714/776 |
| 2015/0256202 | A1* | 9/2015 | Park | H03M 13/1165 714/762 |
| 2015/0270853 | A1* | 9/2015 | Jeong | H03M 13/2792 714/752 |
| 2015/0270854 | A1* | 9/2015 | Park | H03M 13/036 714/776 |
| 2015/0280747 | A1* | 10/2015 | Park | H03M 13/2778 714/752 |
| 2015/0339190 | A1* | 11/2015 | Park | H03M 13/1102 714/766 |
| 2015/0339191 | A1* | 11/2015 | Park | G06F 11/1076 714/766 |
| 2015/0341047 | A1* | 11/2015 | Park | G06F 11/1076 714/766 |
| 2015/0341048 | A1* | 11/2015 | Park | H03M 13/1102 714/766 |
| 2015/0341052 | A1* | 11/2015 | Jeong | H03M 13/1102 714/776 |
| 2015/0341053 | A1* | 11/2015 | Kim | H03M 13/1102 714/776 |
| 2015/0341054 | A1* | 11/2015 | Myung | H03M 13/1102 714/776 |
| 2016/0013809 | A1* | 1/2016 | Myung | H03M 13/1165 714/776 |
| 2016/0049952 | A1* | 2/2016 | Park | H03M 13/1102 714/776 |
| 2016/0049956 | A1* | 2/2016 | Park | H04L 1/0057 714/776 |

OTHER PUBLICATIONS

Yiyan Wu et al., "Cloud Transmission: A New Spectrum-Reuse Friendly Digital Terrestrial Broadcasting Transmission System", IEEE Transactions on Broadcasting, Sep. 2012, pp. 329-337, vol. 58, No. 3.

"Digital Video Broadcasting (DVB); Frame structure channel coding and modulation for a second generation digital terrestrial television broadcasting system (DVB-T2)," Final draft ETSI EN 302 755, Oct. 2010, pp. 1-177, vol. 1.2.1, European Telecommunications Stadards Institute, http://www.etsi.org/deliver/etsi_en/302700_302799/302755/01.02.01_40/en_302755v010201o.pdf.

"Proposal to the ATSC 3.0 PHY Layer CfP Cloud Transmission for the ATSC 3.0 PHY Layer," A Joint Proposal by Communications Research Centre Canada and Electronics and Telecommunications Research Institute Korea, Sep. 26, 2013, pp. 1-101, CRC Canada and ETRI Korea.

"Updated Proposal to the ATSC 3.0 PHY Layer CfP Cloud Transmission for the ATSC 3.0 PHY Layer," A Joint Proposal by Communications Research Centre Canada and Electronics and Telecommunications Research Institute Korea, Oct. 21, 2013, pp. 1-138, CRC Canada and ETRI Korea.

"Updated Proposal to the ATSC 3.0 PHY Layer CfP Cloud Transmission for the ATSC 3.0 PHY Layer," A Joint Proposal by Communications Research Centre Canada and Electronics and Telecommunications Research Institute Korea, Dec. 5, 2013, pp. 1-138, CRC Canada and ETRI Korea.

Yung-Sik Kwon, Declaration filed on Jun. 14, 2016 in related Nonprovisional U.S. Appl. No. 15/018,762, in support of the cited document entitled "Proposal to the ATSC 3.0 PHY Layer CfP Cloud Transmission for the ATSC 3.0 PHY Layer.".

* cited by examiner

LOW DENSITY PARITY CHECK ENCODER HAVING LENGTH OF 16200 AND CODE RATE OF 5/15, AND LOW DENSITY PARITY CHECK ENCODING METHOD USING THE SAME

CROSS-REFERENCE TO RELATED APPLICATIONS

This application is a continuation of U.S. application Ser. No. 15/272,163, filed Sep. 21, 2016, which is a continuation of U.S. application Ser. No. 14/496,432, filed Sep. 25, 2014 (now U.S. Pat. No. 9,479,289 issued on Oct. 25, 2016), which claims the benefit of Korean Patent Application Nos. 10-2014-0106176 and 10-2014-0120011, filed Aug. 14, 2014 and Sep. 11, 2014, respectively, which are hereby incorporated by reference herein in their entirety.

BACKGROUND

1. Technical Field

The present disclosure relates generally to a low density parity check (LDPC) code that is used to correct errors occurring over a wireless channel, and, more particularly, to an LDPC code that is applicable to a digital broadcasting system.

2. Description of the Related Art

Current terrestrial television (TV) broadcasting generates co-channel interference across an area within a distance that is three times a service radius, and thus the same frequency cannot be reused in the area within the distance that is three times the service radius. An area in which the same frequency cannot be reused is called a white space. Spectrum efficiency significantly deteriorates due to the occurrence of a white space.

Accordingly, there arises a need for the development of a transmission technology that facilitates the elimination of a white space and the reuse of a frequency with an emphasis on reception robustness in order to improve spectrum efficiency.

In response to this, the paper "Cloud Transmission: A New Spectrum-Reuse Friendly Digital Terrestrial Broadcasting Transmission System" published on September of 2012 in IEEE Transactions on Broadcasting, Vol. 58, No. 3 proposes a terrestrial cloud transmission technology that facilitates reuse, does not generate a white space, and makes the construction and operation of a single frequency network easy.

Using this terrestrial cloud transmission technology, a broadcasting station can transmit the same nationwide content or locally different content over a single broadcasting channel. However, for this purpose, a receiver should receive one or more terrestrial cloud broadcast signals in an area in which signals transmitted from different transmitters overlap each other, that is, an overlap area, over a single frequency network, and then should distinguish and demodulate the received terrestrial cloud broadcast signals. That is, the receiver should demodulate one or more cloud broadcast signals in a situation in which co-channel interference is present and the timing and frequency synchronization between transmitted signals are not guaranteed.

Meanwhile, Korean Patent Application Publication No. 2013-0135746 entitled "Low Density Parity Check Code for Terrestrial Cloud Transmission" discloses an LDPC code that is optimized for terrestrial cloud transmission and exhibits excellent performance at low code rate (<0.5).

However, Korean Patent Application Publication No. 2013-0135746 is directed to a code length completely different from an LDPC code length used in the DVB broadcast standard, etc., and does not teach a specific LDPC encoding method.

SUMMARY

At least one embodiment of the present invention is directed to the provision of a new LDPC codeword having a length of 16200 and a code rate of 5/15, which is capable of being used for general purposes.

At least one embodiment of the present invention is directed to the provision of an LDPC encoding technique that is capable of efficiently performing LDPC encoding using a sequence having a number of rows equal to a value that is obtained by dividing the sum of the length of the systematic part of an LDPC codeword, that is, 5400, and the length of the first parity part of the LDPC codeword, that is, 720, by 360.

In accordance with an aspect of the present invention, there is provided an LDPC encoder, including first memory configured to store an LDPC codeword having a length of 16200 and a code rate of 5/15; second memory configured to be initialized to 0; and a processor configured to generate the LDPC codeword corresponding to information bits by performing accumulation with respect to the second memory using a sequence corresponding to a parity check matrix (PCM).

The accumulation may be performed at parity bit addresses that are updated using the sequence corresponding to the PCM.

The LDPC codeword may include a systematic part corresponding to the information bits and having a length of 5400, a first parity part corresponding to a dual diagonal matrix included in the PCM and having a length of 720, and a second parity part corresponding to an identity matrix included in the PCM and having a length of 10080.

The sequence may have a number of rows equal to the sum of a value obtained by dividing a length of the systematic part, that is, 5400, by a circulant permutation matrix (CPM) size corresponding to the PCM, that is, 360, and a value obtained by dividing a length of the first parity part, that is, 720, by the CPM size.

The sequence may be represented by the following Sequence Table:

Sequence Table

1st row: 69 244 706 5145 5994 6066 6763 6815 8509
2nd row: 257 541 618 3933 6188 7048 7484 8424 9104
3rd row: 69 500 536 1494 1669 7075 7553 8202 10305
4th row: 11 189 340 2103 3199 6775 7471 7918 10530
5th row: 333 400 434 1806 3264 5693 8534 9274 10344
6th row: 111 129 260 3562 3676 3680 3809 5169 7308 8280
7th row: 100 303 342 3133 3952 4226 4713 5053 5717 9931
8th row: 83 87 374 828 2460 4943 6311 8657 9272 9571
9th row: 114 166 325 2680 4698 7703 7886 8791 9978 10684
10th row: 281 542 549 1671 3178 3955 7153 7432 9052 10219
11st row: 202 271 608 3860 4173 4203 5169 6871 8113 9757
12nd row: 16 359 419 3333 4198 4737 6170 7987 9573 10095
13rd row: 235 244 584 4640 5007 5563 6029 6816 7678 9968
14th row: 123 449 646 2460 3845 4161 6610 7245 7686 8651
15th row: 136 231 468 835 2622 3292 5158 5294 6584 9926
16th row: 3085 4683 8191 9027 9922 9928 10550
17th row: 2462 3185 3976 4091 8089 8772 9342

The accumulation may be performed while the rows of the sequence are being repeatedly changed by the CPM size of the PCM.

In accordance with an aspect of the present invention, there is provided an LDPC encoding method, including initializing first memory configured to store an LDPC codeword having a length of 16200 and a code rate of 5/15 and second memory; and generating the LDPC codeword corresponding to information bits by performing accumulation with respect to the second memory using a sequence corresponding to a PCM.

The accumulation may be performed at parity bit addresses that are updated using the sequence corresponding to the PCM.

The LDPC codeword may include a systematic part corresponding to the information bits and having a length of 5400, a first parity part corresponding to a dual diagonal matrix included in the PCM and having a length of 720, and a second parity part corresponding to an identity matrix included in the PCM and having a length of 10080.

The sequence may have a number of rows equal to the sum of a value obtained by dividing a length of the systematic part, that is, 5400, by a circulant permutation matrix (CPM) size corresponding to the PCM, that is, 360, and a value obtained by dividing a length of the first parity part, that is, 720, by the CPM size.

The sequence may be represented by the above Sequence Table.

In accordance with still another aspect of the present invention, there is provided an LDPC decoder, including a receiving unit configured to receive an LDPC codeword encoded using a sequence corresponding to a PCM and is represented by the above Sequence Table; and a decoding unit configured to restore information bits from the received LDPC codeword by performing decoding corresponding to the PCM.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION

Figure 1:
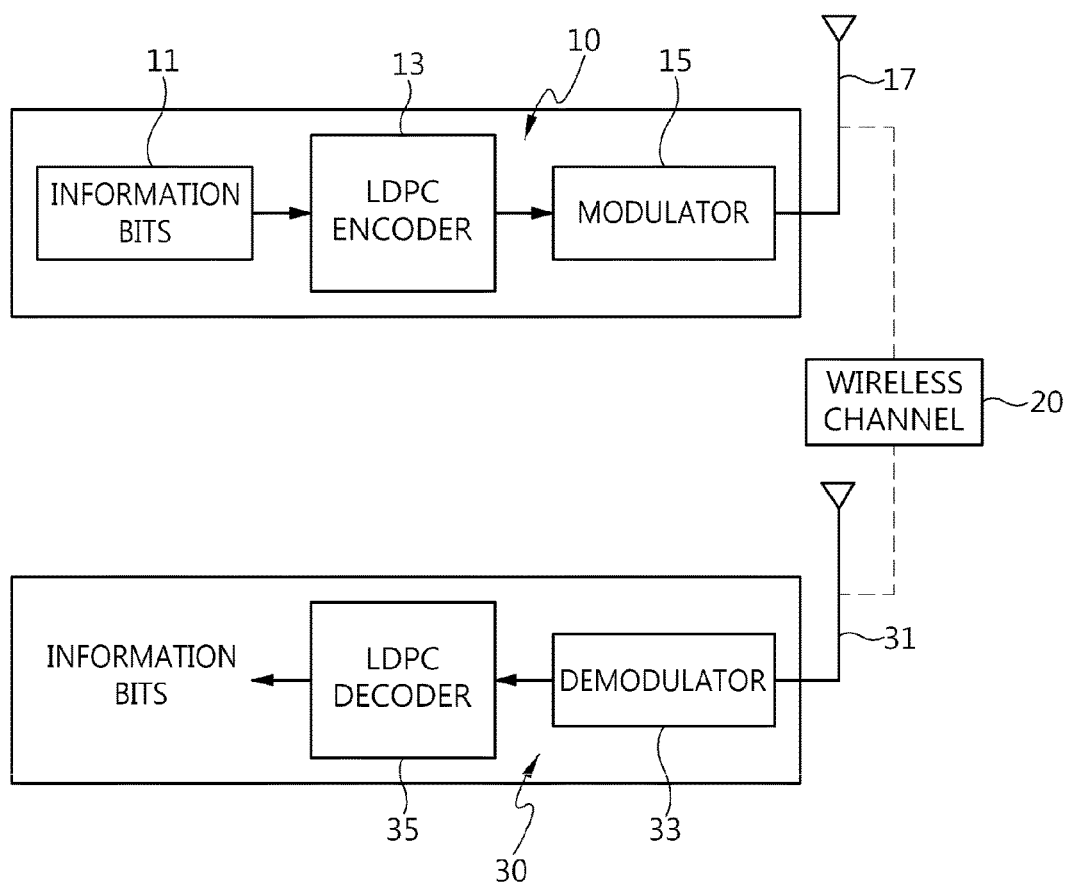
FIG. 1 is a block diagram illustrating a broadcast signal transmission and reception system according to an embodiment of the present invention.

Embodiments of the present invention will be described in detail below with reference to the accompanying drawings. Repeated descriptions and descriptions of well-known functions and configurations that have been deemed to make the gist of the present invention unnecessarily obscure will be omitted below. The embodiments of the present invention are intended to fully describe the present invention to persons having ordinary knowledge in the art to which the present invention pertains. Accordingly, the shapes, sizes, etc. of components in the drawings may be exaggerated to make the description obvious.

Embodiments of the present invention will be described in detail below with reference to the accompanying drawings.

FIG. 1 is a block diagram illustrating a broadcast signal transmission and reception system according to an embodiment of the present invention.

Referring to FIG. 1, it can be seen that a transmitter 10 and a receiver 30 communicate with each other over a wireless channel 20.

The transmitter 10 generates an n-bit codeword by encoding k information bits using an LDPC encoder 13. The codeword is modulated by the modulator 15, and is transmitted via an antenna 17. The signal transmitted via the wireless channel 20 is received via the antenna 31 of the receiver 30, and, in the receiver 30, is subjected to a process reverse to the process in the transmitter 10. That is, the received data is demodulated by a demodulator 33, and is then decoded by an LDPC decoder 35, thereby finally restoring the information bits.

It will be apparent to those skilled in the art that the above-described transmission and reception processes have been described within a minimum range required for a description of the features of the present invention and various processes required for data transmission may be added.

In the following, the specific processes of encoding and decoding that are performed using an LDPC code in the LDPC encoder 13 or LDPC decoder 35 and the specific configurations of encoding and decoding devices, such as the LDPC encoder 13 and the LDPC decoder 35, are described. The LDPC encoder 13 illustrated in FIG. 1 may have a structure illustrated in FIG. 4, and the LDPC decoder 35 may have a structure illustrated in FIG. 5.

Figure 2:
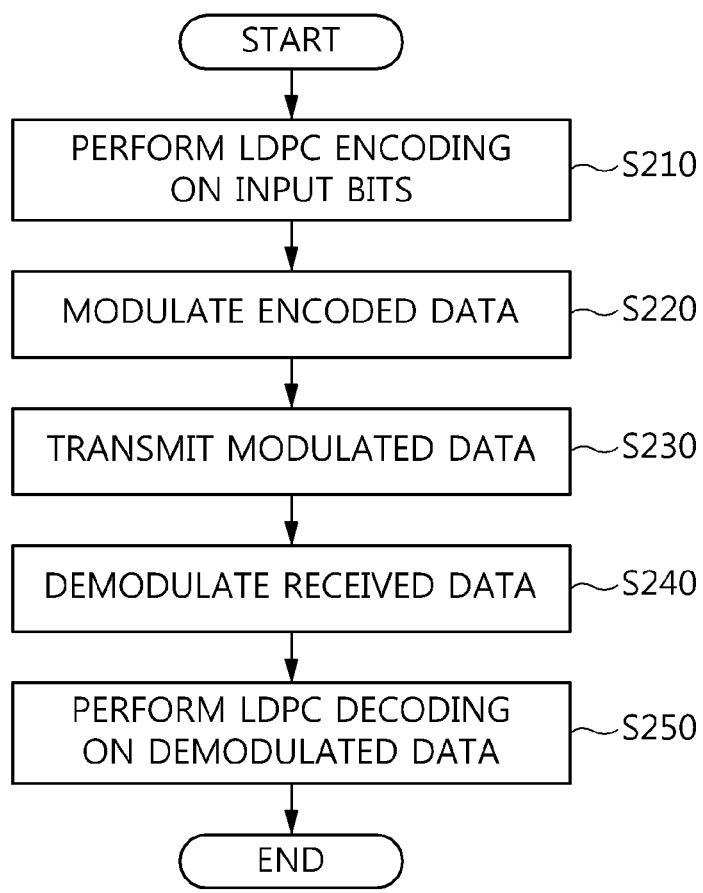
FIG. 2 is an operation flowchart illustrating a broadcast signal transmission and reception method according to an embodiment of the present invention.

FIG. 2 is an operation flowchart illustrating a broadcast signal transmission and reception method according to an embodiment of the present invention.

Referring to FIG. 2, in the broadcast signal transmission and reception method according to this embodiment of the present invention, input bits (information bits) are subjected to LDPC encoding at step S210.

That is, at step S210, an n-bit codeword is generated by encoding k information bits using the LDPC encoder.

Figure 6:
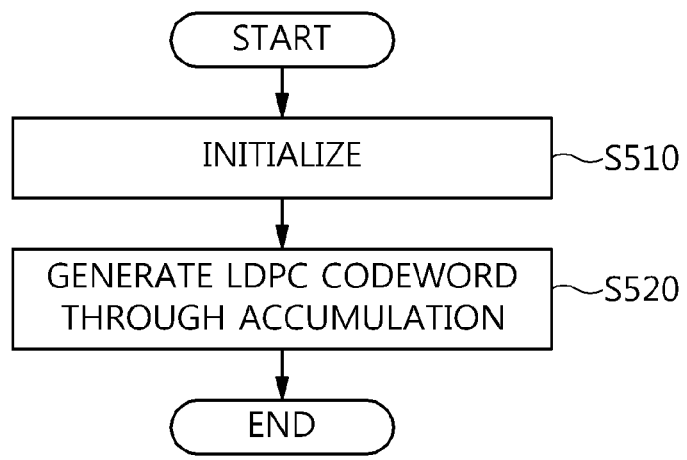
FIG. 6 is an operation flowchart illustrating an LDPC encoding method according to an embodiment of the present invention.

In this case, step S210 may be performed as in an LDPC encoding method illustrated in FIG. 6.

Furthermore, in the broadcast signal transmission and reception method, the encoded data is modulated at step S220.

That is, at step S220, the encoded n-bit codeword is modulated using the modulator.

Furthermore, in the broadcast signal transmission and reception method, the modulated data is transmitted at step S230.

That is, at step S230, the modulated codeword is transmitted over a wireless channel via the antenna.

Furthermore, in the broadcast signal transmission and reception method, the received data is demodulated at step S240.

That is, at step S240, the signal transmitted over the wireless channel is received via the antenna of the receiver, and the received data is demodulated using the demodulator.

Furthermore, in the broadcast signal transmission and reception method, the demodulated data is subjected to LDPC decoding at step S250.

That is, at step S250, the information bits are finally restored by performing LDPC decoding using the demodulator of the receiver.

Figure 5:
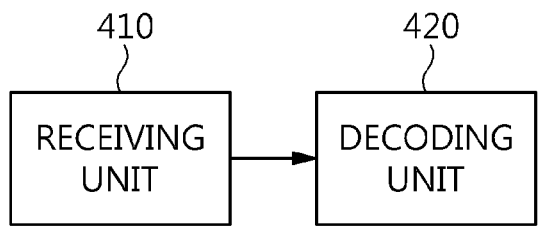
FIG. 5 is a block diagram illustrating an LDPC decoder according to an embodiment of the present invention.

In this case, step S250 corresponds to a process reverse to that of the LDPC encoding method illustrated in FIG. 6, and may correspond to the LDPC decoder of FIG. 5.

An LDPC code is known as a code very close to the Shannon limit for an additive white Gaussian noise (AWGN) channel, and has the advantages of asymptotically excellent performance and parallelizable decoding compared to a turbo code.

Generally, an LDPC code is defined by a low-density parity check matrix (PCM) that is randomly generated. However, a randomly generated LDPC code requires a large amount of memory to store a PCM, and requires a lot of time to access memory. In order to overcome these problems, a quasi-cyclic LDPC (QC-LDPC) code has been proposed. A QC-LDPC code that is composed of a zero matrix or a circulant permutation matrix (CPM) is defined by a PCM that is expressed by the following Equation 1:

$$H = \begin{bmatrix} J^{a_{11}} & J^{a_{12}} & \cdots & J^{a_{1n}} \\ J^{a_{21}} & J^{a_{22}} & \cdots & J^{a_{2n}} \\ \vdots & \vdots & \ddots & \vdots \\ J^{a_{m1}} & J^{a_{m2}} & \cdots & J^{a_{mn}} \end{bmatrix}, \text{ for } a_{ij} \in \{0, 1, \ldots, L-1, \infty\} \quad (1)$$

In this equation, J is a CPM having a size of L×L, and is given as the following Equation 2. In the following description, L may be 360.

$$J_{L \times L} = \begin{bmatrix} 0 & 1 & 0 & \cdots & 0 \\ 0 & 0 & 1 & \cdots & 0 \\ \vdots & \vdots & \vdots & \ddots & \vdots \\ 0 & 0 & 0 & \cdots & 1 \\ 1 & 0 & 0 & \cdots & 0 \end{bmatrix} \quad (2)$$

Furthermore, $J^i$ is obtained by shifting an L×L identity matrix I ($J^0$) to the right i (0≤i<L) times, and $J^\infty$ is an L×L zero matrix. Accordingly, in the case of a QC-LDPC code, it is sufficient if only index exponent i is stored in order to store $J^i$, and thus the amount of memory required to store a PCM is considerably reduced.

Figure 3:
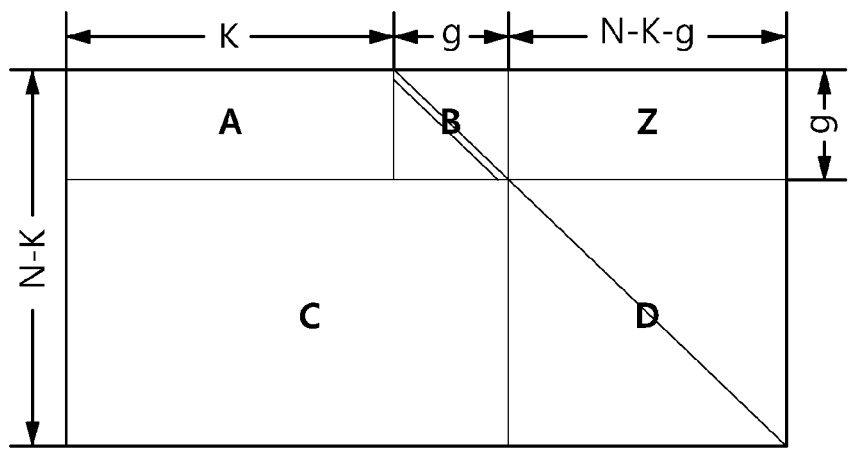
FIG. 3 is a diagram illustrating the structure of a PCM corresponding to an LDPC code to according to an embodiment of the present invention.

FIG. 3 is a diagram illustrating the structure of a PCM corresponding to an LDPC code to according to an embodiment of the present invention.

Referring to FIG. 3, the sizes of matrices A and C are g×K and (N−K−g)×(K+g), respectively, and are composed of an L×L zero matrix and a CPM, respectively. Furthermore, matrix Z is a zero matrix having a size of g×(N−K−g), matrix D is an identity matrix having a size of (N−K−g)×(N−K−g), and matrix B is a dual diagonal matrix having a size of g×g. In this case, the matrix B may be a matrix in which all elements except elements along a diagonal line and neighboring elements below the diagonal line are 0, and may be defined as the following Equation 3:

$$B_{g \times g} = \begin{bmatrix} I_{L \times L} & 0 & 0 & \cdots & 0 & 0 & 0 \\ I_{L \times L} & I_{L \times L} & 0 & \cdots & 0 & 0 & 0 \\ 0 & I_{L \times L} & I_{L \times L} & \vdots & 0 & 0 & 0 \\ \vdots & \vdots & \vdots & \vdots & \vdots & \vdots & \vdots \\ 0 & 0 & 0 & \cdots & I_{L \times L} & I_{L \times L} & 0 \\ 0 & 0 & 0 & \cdots & 0 & I_{L \times L} & I_{L \times L} \end{bmatrix} \quad (3)$$

where $I_{L \times L}$ is an identity matrix having a size of L×L.

That is, the matrix B may be a bit-wise dual diagonal matrix, or may be a block-wise dual diagonal matrix having identity matrices as its blocks, as indicated by Equation 3. The bit-wise dual diagonal matrix is disclosed in detail in Korean Patent Application Publication No. 2007-0058438, etc.

In particular, it will be apparent to those skilled in the art that when the matrix B is a bit-wise dual diagonal matrix, it is possible to perform conversion into a Quasi-cyclic form by applying row or column permutation to a PCM including the matrix B and having a structure illustrated in FIG. 3.

In this case, N is the length of a codeword, and K is the length of information.

The present invention proposes a newly designed QC-LDPC code in which the code rate thereof is 5/15 and the length of a codeword is 16200, as illustrated in the following Table 1. That is, the present invention proposes an LDPC code that is designed to receive information having a length of 5400 and generate an LDPC codeword having a length of 16200.

Table 1 illustrates the sizes of the matrices A, B, C, D and Z of the QC-LDPC code according to the present invention:

TABLE 1

| | | Sizes | | | | |
|---|---|---|---|---|---|---|
| Code rate | Length | A | B | C | D | Z |
| 5/15 | 16200 | 720 × 5400 | 720 × 720 | 10080 × 6120 | 10080 × 10080 | 720 × 10080 |

The newly designed LDPC code may be represented in the form of a sequence (progression), an equivalent relationship is established between the sequence and matrix (parity bit check matrix), and the sequence may be represented, as follows:

| Sequence Table |
|---|
| 1st row: 69 244 706 5145 5994 6066 6763 6815 8509 |
| 2nd row: 257 541 618 3933 6188 7048 7484 8424 9104 |

Sequence Table

3rd row: 69 500 536 1494 1669 7075 7553 8202 10305
4th row: 11 189 340 2103 3199 6775 7471 7918 10530
5th row: 333 400 434 1806 3264 5693 8534 9274 10344
6th row: 111 129 260 3562 3676 3680 3809 5169 7308 8280
7th row: 100 303 342 3133 3952 4226 4713 5053 5717 9931
8th row: 83 87 374 828 2460 4943 6311 8657 9272 9571
9th row: 114 166 325 2680 4698 7703 7886 8791 9978 10684
10th row: 281 542 549 1671 3178 3955 7153 7432 9052 10219
11st row: 202 271 608 3860 4173 4203 5169 6871 8113 9757
12nd row: 16 359 419 3333 4198 4737 6170 7987 9573 10095
13rd row: 235 244 584 4640 5007 5563 6029 6816 7678 9968
14th row: 123 449 646 2460 3845 4161 6610 7245 7686 8651
15th row: 136 231 468 835 2622 3292 5158 5294 6584 9926
16th row: 3085 4683 8191 9027 9922 9928 10550
17th row: 2462 3185 3976 4091 8089 8772 9342

An LDPC code that is represented in the form of a sequence is being widely used in the DVB standard.

According to an embodiment of the present invention, an LDPC code presented in the form of a sequence is encoded, as follows. It is assumed that there is an information block $S=(s_0, s_1, \ldots, s_{K-1})$ having an information size K. The LDPC encoder generates a codeword $\Lambda=(\lambda_0, \lambda_1, \lambda_2, \ldots, \lambda_{N-1})$ having a size of $N=K+M_1+M_2$ using the information block S having a size K. In this case, $M_1=g$, and $M_2=N-K-g$. Furthermore, $M_1$ is the size of parity bits corresponding to the dual diagonal matrix B, and $M_2$ is the size of parity bits corresponding to the identity matrix D. The encoding process is performed, as follows:

Initialization:

$$\lambda_i = s_i \text{ for } i=0,1,\ldots,K-1$$

$$p_j = 0 \text{ for } j=0,1,\ldots,M_1+M_2-1 \quad (4)$$

First information bit $\lambda_0$ is accumulated at parity bit addresses specified in the 1st row of the sequence of the Sequence Table. For example, in an LDPC code having a length of 16200 and a code rate of 5/15, an accumulation process is as follows:

$p_{69}=p_{69}\oplus\lambda_0$ $p_{244}=p_{244}\oplus\lambda_0$ $p_{706}=p_{706}\oplus\lambda_0$
$p_{5145}=p_{5145}\oplus\lambda_0$ $p_{5994}=p_{5994}\oplus\lambda_0$
$p_{6066}=p_{6066}\oplus\lambda_0$ $p_{6763}=p_{6763}\oplus\lambda_0$
$p_{6815}=p_{6815}\oplus\lambda_0$ $p_{8509}=p_{8509}\oplus\lambda_0$ where the addition $\oplus$ occurs in GF(2).

The subsequent L−1 information bits, that is, $\lambda_m$, m=1, 2, ..., L−1, are accumulated at parity bit addresses that are calculated by the following Equation 5:

$(x+m \times Q_1) \bmod M_1 \text{ if } x<M_1$ $M_1 + \{(x-M_1+m \times Q_2) \bmod M_2\} \text{ if } x \geq M_1$ (5)

where x denotes the addresses of parity bits corresponding to the first information bit $\lambda_0$, that is, the addresses of the parity bits specified in the first row of the sequence of the Sequence Table, $Q_1=M_1/L$, $Q_2=M_2/L$, and L=360. Furthermore, $Q_1$ and $Q_2$ are defined in the following Table 2. For example, for an LDPC code having a length of 16200 and a code rate of 5/15, $M_1=720$, $Q_1=2$, $M_2=10080$, $Q_2=28$ and L=360, and the following operations are performed on the second bit $\lambda_1$ using Equation 5:

$p_{71}=p_{71}\oplus\lambda_1$ $p_{246}=p_{246}\oplus\lambda_1$ $p_{708}=p_{708}\oplus\lambda_1$
$p_{5173}=p_{5173}\oplus\lambda_1$ $p_{6022}=p_{6022}\oplus\lambda_1$
$p_{6094}=p_{6094}\oplus\lambda_1$ $p_{6791}=p_{6791}\oplus\lambda_1$
$p_{6843}=p_{6843}\oplus\lambda_1$ $p_{8537}=p_{8537}\oplus\lambda_1$ Table 2 illustrates the sizes of $M_1$, $Q_1$, $M_2$ and $Q_2$ of the designed QC-LDPC code:

TABLE 2

| Code rate | Length | Sizes | | | |
| --- | --- | --- | --- | --- | --- |
| | | $M_1$ | $M_2$ | $Q_1$ | $Q_2$ |
| 5/15 | 16200 | 720 | 10080 | 2 | 28 |

The addresses of parity bit accumulators for new 360 information bits from $\lambda_L$ to $\lambda_{2L-1}$ are calculated and accumulated from Equation 5 using the second row of the sequence.

In a similar manner, for all groups composed of new L information bits, the addresses of parity bit accumulators are calculated and accumulated from Equation 5 using new rows of the sequence.

After all the information bits from $\lambda_0$ to $\lambda_{K-1}$ have been exhausted, the operations of the following Equation 6 are sequentially performed from i=1:

$$p_i = p_i \oplus p_{i-1} \text{ for } i=0,1,\ldots,M_1-1 \quad (6)$$

Thereafter, when a parity interleaving operation, such as that of the following Equation 7, is performed, parity bits corresponding to the dual diagonal matrix B are generated:

$$\lambda_{K+L \cdot t+s} = p_{Q_1 \cdot s+t} \text{ for } 0 \leq s < L, \, 0 \leq t < Q_1 \quad (7)$$

When the parity bits corresponding to the dual diagonal matrix B have been generated using K information bits $\lambda_0, \lambda_1, \ldots, \lambda_{K-1}$, parity bits corresponding to the identity matrix D are generated using the $M_1$ generated parity bits $\lambda_K, \lambda_{K+1}, \ldots, \lambda_{K+M_1-1}$.

For all groups composed of L information bits from $\lambda_K$ to $\lambda_{K+M_1-1}$, the addresses of parity bit accumulators are calculated using the new rows (starting with a row immediately subsequent to the last row used when the parity bits corresponding to the dual diagonal matrix B have been generated) of the sequence and Equation 5, and related operations are performed.

When a parity interleaving operation, such as that of the following Equation 8, is performed after all the information bits from $\lambda_K$ to $\lambda_{K+M_1-1}$ have been exhausted, parity bits corresponding to the identity matrix D are generated:

$$\lambda_{K+M_1+L \cdot t+s} = p_{M_1+Q_2 \cdot s+t} \text{ for } 0 \leq s < L, \, 0 \leq t < Q_2 \quad (8)$$

Figure 4:
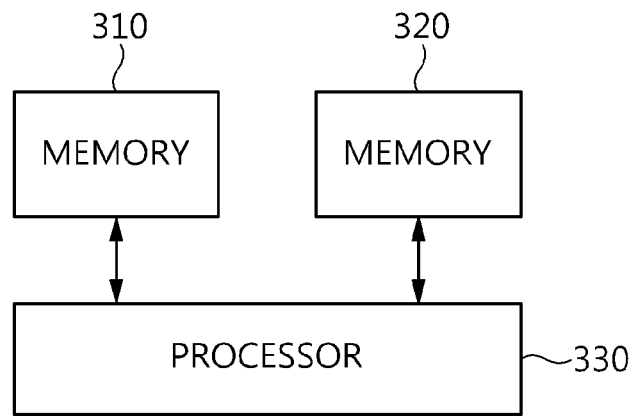
FIG. 4 is a block diagram illustrating an LDPC encoder according to an embodiment of the present invention.

FIG. 4 is a block diagram illustrating an LDPC encoder according to an embodiment of the present invention.

Referring to FIG. 4, the LDPC encoder according to this embodiment of the present invention includes memory 310 and 320 and a processor 330.

The memory 310 is memory that is used to store an LDPC codeword having a length of 16200 and a code rate of 5/15.

The memory 320 is memory that is initialized to 0.

The memory 310 and the memory 320 may correspond to $\lambda_i$ (i=0,1, ..., N−1) and $p_j$ (j=0,1, ..., $M_1+M_2-1$), respectively.

The memory 310 and the memory 320 may correspond to various types of hardware for storing sets of bits, and may correspond to data structures, such as an array, a list, a stack and a queue.

The processor 330 generates an LDPC codeword corresponding to information bits by performing accumulation with respect to the memory 320 using a sequence corresponding to a PCM.

In this case, the accumulation may be performed at parity bit addresses that are updated using the sequence of the above Sequence Table.

In this case, the LDPC codeword may include a systematic part $\lambda_0, \lambda_1, \ldots, \lambda_{K-1}$ corresponding to the information bits and having a length of 5400 (=K), a first parity part $\lambda_K, \lambda_{K+1}, \ldots, \lambda_{K+M_1-1}$ corresponding to a dual diagonal matrix included in the PCM and having a length of 720 (=$M_1$=g), and a second parity part $\lambda_{K+M_1}, \lambda_{K+M_1+1}, \ldots, \lambda_{K+M_1+M_2-1}$ corresponding to an identity matrix included in the PCM and having a length of 10080 (=$M_2$).

In this case, the sequence may have a number of rows equal to the sum (5400/360+720/360=17) of a value obtained by dividing the length of the systematic part, that is, 5400, by a CPM size L corresponding to the PCM, that is, 360, and a value obtained by dividing the length $M_1$ of the first parity part, that is, 720, by 360.

As described above, the sequence may be represented by the above Sequence Table.

In this case, the memory 320 may have a size corresponding to the sum $M_1+M_2$ of the length $M_1$ of the first parity part and the length $M_2$ of the second parity part.

In this case, the parity bit addresses may be updated based on the results of comparing each x of the previous parity bit addresses specified in respective rows of the sequence with the length $M_1$ of the first parity part.

That is, the parity bit addresses may be updated using Equation 5. In this case, x may be the previous parity bit addresses, m may be an information bit index that is an integer larger than 0 and smaller than L, L may be the CPM size of the PCM, $Q_1$ may be $M_1/L$, $M_1$ may be the size of the first parity part, $Q_2$ may be $M_2/L$, and $M_2$ may be the size of the second parity part.

In this case, it may be possible to perform the accumulation while repeatedly changing the rows of the sequence by the CPM size L (=360) of the PCM, as described above.

In this case, the first parity part $\lambda_K, \lambda_{K+1}, \ldots, \lambda_{K+M_1-1}$ may be generated by performing parity interleaving using the memory 310 and the memory 320, as described in conjunction with Equation 7.

In this case, the second parity part $\lambda_{K+M_1}, \lambda_{K+M_1+1}, \ldots, \lambda_{K+M_1+M_2-1}$ may be generated by performing parity interleaving using the memory 310 and the memory 320 after generating the first parity part $\lambda_K, \lambda_{K+1}, \ldots, \lambda_{K+M_1-1}$ and then performing the accumulation using the first parity part $\lambda_K, \lambda_{K+1}, \ldots, \lambda_{K+M_1-1}$ and the sequence, as described in conjunction with Equation 8.

FIG. 5 is a block diagram illustrating an LDPC decoder according to an embodiment of the present invention.

Referring to FIG. 5, the LDPC decoder according to this embodiment of the present invention may include a receiving unit 410 and a decoding unit 420.

The receiving unit 410 receives an LDPC codeword that has been encoded using a sequence that corresponds to a PCM and is represented by the above Sequence Table.

The decoding unit 420 restores information bits from the received LDPC codeword by performing decoding corresponding to the PCM.

In this case, the sequence may be used to update the parity bit addresses of the memory, and the parity bit addresses are used for accumulation that is performed to generate parity bits corresponding to the LDPC codeword.

In this case, the LDPC codeword may include a systematic part $\lambda_0, \lambda_1, \ldots, \lambda_{K-1}$ corresponding to the information bits, a first parity part $\lambda_K, \lambda_{K+1}, \ldots, \lambda_{K+M_1-1}$ corresponding to a dual diagonal matrix included in the PCM, and a second parity part $\lambda_{K+M_1}, \lambda_{K+M_1+1}, \ldots, \lambda_{K+M_1+M_2-1}$ corresponding to an identity matrix included in the PCM.

In this case, the parity bit addresses may be updated based on the results of comparing each x of the previous parity bit addresses specified in respective rows of the sequence with the length $M_1$ of the first parity part.

That is, the parity bit addresses may be updated using Equation 5. In this case, x may be the previous parity bit addresses, m may be an information bit index that is an integer larger than 0 and smaller than L, L may be the CPM size of the PCM, $Q_1$ may be $M_1/L$, $M_1$ may be the size of the first parity part, $Q_2$ may be $M_2/L$, and $M_2$ may be the size of the second parity part.

FIG. 6 is an operation flowchart illustrating an LDPC encoding method according to an embodiment of the present invention.

Referring to FIG. 6, the LDPC encoding method according to this embodiment of the present invention initializes the first memory that stores an LDPC codeword having a length of 16200 and a code rate of 5/15, and second memory at step S510.

In this case, step S510 may be performed using Equation 4.

Furthermore, in the LDPC encoding method according to this embodiment of the present invention, an LDPC codeword corresponding to information bits is generated by performing accumulation with respect to the second memory using a sequence corresponding to a PCM at step S520.

In this case, the accumulation may be performed at parity bit addresses that are updated using the sequence corresponding to the PCM.

In this case, the LDPC codeword may include a systematic part $\lambda_0, \lambda_1, \ldots, \lambda_{K-1}$ corresponding to the information bits and having a length of 5400 (=K), a first parity part $\lambda_K, \lambda_{K+1}, \ldots, \lambda_{K+M_1-1}$ corresponding to a dual diagonal matrix included in the PCM and having a length of 720 (=$M_1$=g), and a second parity part $\lambda_{K+M_1}, \lambda_{K+M_1+1}, \ldots, \lambda_{K+M_1+M_2-1}$ corresponding to an identity matrix included in the PCM and having a length of 10080 (=$M_2$).

In this case, the sequence may have a number of rows equal to the sum (5400/360+720/360=17) of a value obtained by dividing the length of the systematic part, that is, 5400, by a CPM size L corresponding to the PCM, that is, 360, and a value obtained by dividing the length $M_1$ of the first parity part, that is, 720, by 360.

As described above, the sequence may be represented by the above Sequence Table.

In this case, the parity bit addresses may be updated based on the results of comparing each x of the previous parity bit addresses specified in respective rows of the sequence with the length $M_1$ of the first parity part.

That is, the parity bit addresses may be updated using Equation 5. In this case, x may be the previous parity bit addresses, m may be an information bit index that is an integer larger than 0 and smaller than L, L may be the CPM size of the PCM, $Q_1$ may be $M_1/L$, $M_1$ may be the size of the first parity part, $Q_2$ may be $M_2/L$, and $M_2$ may be the size of the second parity part.

In this case, it may be possible to perform the accumulation while repeatedly changing the rows of the sequence by the CPM size L (=360) of the PCM, as described above.

In this case, the first parity part $\lambda_K, \lambda_{K+1}, \ldots, \lambda_{K+M_1-1}$ may be generated by performing parity interleaving using the memory 310 and the memory 320, as described in conjunction with Equation 7.

In this case, the second parity part $\lambda_{K+M_1}, \lambda_{K+M_1+1}, \ldots, \lambda_{K+M_1+M_2-1}$ may be generated by performing parity interleaving using the memory 310 and the memory 320 after generating the first parity part $\lambda_K, \lambda_{K+1}, \ldots, \lambda_{K+M_1-1}$ and then performing the accumulation using the first parity part $\lambda_K, \lambda_{K+1}, \ldots, \lambda_{K+M_1-1}$ and the sequence, as described in conjunction with Equation 8.

Figure 7:
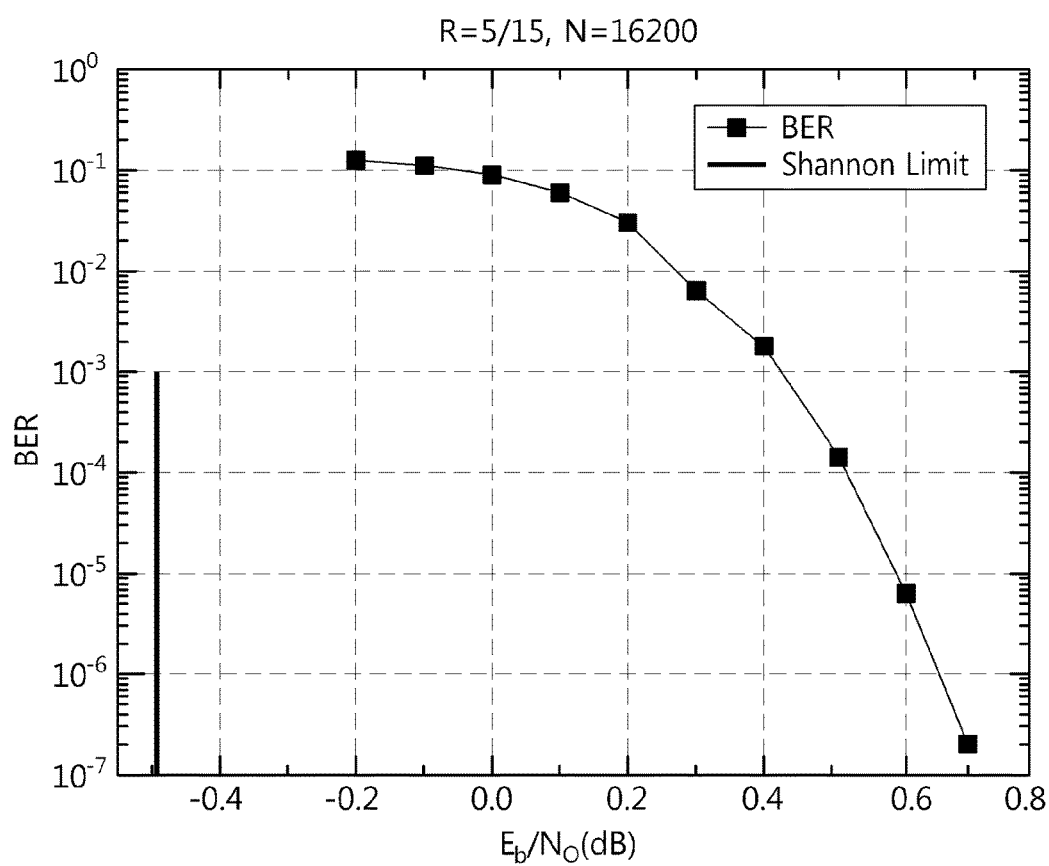
FIG. 7 is a graph plotting the performance of a QC-LDPC code having a length of 16200 and a code rate of 5/15 according to an embodiment of the present invention against $E_b/N_o$.

FIG. 7 is a graph plotting the performance of a QC-LDPC code having a length of 16200 and a code rate of 5/15 according to an embodiment of the present invention against $E_b/N_o$.

The graph illustrated in FIG. 7 illustrates results that were obtained on the assumption that a log-likelihood ratio (LLR)-based sum-product algorithm in which binary phase shift keying (BPSK) modulation and 50 rounds of repetitive decoding were performed was used for computational experiments. As illustrated in FIG. 7, it can be seen that the designed code is away from the Shannon limit by about 1.2 dB at BER=$10^{-6}$.

At least one embodiment of the present invention has the advantage of providing a new LDPC codeword having a length of 16200 and a code rate of 5/15, which is capable of being used for general purposes.

At least one embodiment of the present invention has the advantage of providing an LDPC encoding technique that is capable of efficiently performing LDPC encoding using a sequence having a number of rows equal to a value that is obtained by dividing the sum of the length of the systematic part of an LDPC codeword, that is, 5400, and the length of the first parity part of the LDPC codeword, that is, 720, by 360.

Although the specific embodiments of the present invention have been disclosed for illustrative purposes, those skilled in the art will appreciate that various modifications, additions and substitutions are possible without departing from the scope and spirit of the invention as disclosed in the accompanying claims.

What is claimed is:

1. A transmitter for a broadcast signal, comprising:
an LDPC encoder configured to generate an LDPC codeword having a length of 16200 and a code rate of 5/15 by performing accumulation with respect to memory initialized to 0, using a sequence corresponding to a parity check matrix (PCM), the LDPC codeword corresponding to information bits;
a modulator configured to perform modulation corresponding to the LDPC codeword in order to generate a modulated signal; and
an antenna configured to transmit a transmission signal over a physical channel, the transmission signal being generated using the modulated signal corresponding to the LDPC codeword, the LDPC codeword including parity bits for correcting errors over the physical channel,
wherein the sequence is represented by the following Sequence Table:

| Sequence Table |
| --- |
| 1st row: 69 244 706 5145 5994 6066 6763 6815 8509 |
| 2nd row: 257 541 618 3933 6188 7048 7484 8424 9104 |
| 3rd row: 69 500 536 1494 1669 7075 7553 8202 10305 |
| 4th row: 11 189 340 2103 3199 6775 7471 7918 10530 |
| 5th row: 333 400 434 1806 3264 5693 8534 9274 10344 |
| 6th row: 111 129 260 3562 3676 3680 3809 5169 7308 8280 |
| 7th row: 100 303 342 3133 3952 4226 4713 5053 5717 9931 |
| 8th row: 83 87 374 828 2460 4943 6311 8657 9272 9571 |
| 9th row: 114 166 325 2680 4698 7703 7886 8791 9978 10684 |
| 10th row: 281 542 549 1671 3178 3955 7153 7432 9052 10219 |
| 11st row: 202 271 608 3860 4173 4203 5169 6871 8113 9757 |
| 12nd row: 16 359 419 3333 4198 4737 6170 7987 9573 10095 |
| 13rd row: 235 244 584 4640 5007 5563 6029 6816 7678 9968 |
| 14th row: 123 449 646 2460 3845 4161 6610 7245 7686 8651 |
| 15th row: 136 231 468 835 2622 3292 5158 5294 6584 9926 |
| 16th row: 3085 4683 8191 9027 9922 9928 10550 |
| 17th row: 2462 3185 3976 4091 8089 8772 9342. |

2. The transmitter of claim 1, wherein the LDPC codeword comprises a systematic part corresponding to the information bits and having a length of 5400, a first parity part corresponding to a dual diagonal matrix included in the PCM and having a length of 720, and a second parity part corresponding to an identity matrix included in the PCM and having a length of 10080.

3. The transmitter of claim 2, wherein the sequence has a number of rows equal to a sum of a value obtained by dividing a length of the systematic part, by a circulant permutation matrix (CPM) size corresponding to the PCM, and a value obtained by dividing a length of the first parity part, by the CPM size.

4. The transmitter of claim 3, wherein the accumulation is performed at parity bit addresses that are updated using the sequence.

5. The transmitter of claim 4, wherein the accumulation is performed while the rows of the sequence are being repeatedly changed by the CPM size of the PCM.

* * * * *